United States Patent
Carlson et al.

(10) Patent No.: US 6,376,387 B2
(45) Date of Patent: Apr. 23, 2002

(54) METHOD OF SEALING AN EPITAXIAL SILICON LAYER ON A SUBSTRATE

(75) Inventors: David K Carlson, Santa Clara; Paul B. Comita, Menlo Park; Norma B. Riley, Pleasanton; Dale R. Du Bois, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,805

(22) Filed: Jul. 9, 1999

(51) Int. Cl.[7] .................. H01L 21/302; H01L 21/461
(52) U.S. Cl. ............... 438/716; 438/478; 438/481; 438/492; 438/723; 438/762; 438/770; 156/345
(58) Field of Search ................ 438/716, 723, 438/762, 770, 715; 156/345

(56) References Cited

U.S. PATENT DOCUMENTS

| | | | |
|---|---|---|---|
| 4,341,592 A | | 7/1982 | Shortes et al. |
| 4,409,260 A | | 10/1983 | Pastor et al. |
| 4,872,947 A | | 10/1989 | Wang et al. |
| 4,906,595 A | | 3/1990 | van der Plas et al. |
| 5,057,463 A | | 10/1991 | Bryant et al. |
| 5,089,441 A | | 2/1992 | Moslehi |
| 5,228,208 A | * | 7/1993 | White et al. .............. 34/15 |
| 5,229,334 A | | 7/1993 | Kato |
| 5,259,881 A | * | 11/1993 | Edwards et al. .......... 118/719 |
| 5,292,393 A | * | 3/1994 | Maydan et al. ........... 156/345 |
| 5,294,571 A | | 3/1994 | Fujishiro et al. |
| 5,316,981 A | | 5/1994 | Gardner et al. |
| 5,328,360 A | * | 7/1994 | Yokokawa ................. 432/250 |
| 5,330,935 A | | 7/1994 | Dobuzinsky et al. |
| 5,360,769 A | | 11/1994 | Thakur et al. |
| 5,378,283 A | * | 1/1995 | Ushikawa ................ 118/719 |
| 5,380,682 A | * | 1/1995 | Edwards et al. .......... 438/800 |
| 5,580,419 A | * | 12/1996 | Berenz ...................... 438/171 |
| 5,693,578 A | * | 12/1997 | Nakanishi et al. ........ 438/770 |
| 5,766,360 A | * | 6/1998 | Sato et al. ................ 118/666 |
| 5,981,399 A | * | 11/1999 | Kawamura et al. ....... 438/715 |
| 6,007,675 A | * | 12/1999 | Toshima ................... 156/345 |
| 6,017,820 A | * | 1/2000 | Ting et al. ................ 438/689 |
| 6,072,226 A | * | 6/2000 | Thakur et al. ............. 257/506 |
| 6,077,751 A | * | 6/2000 | Marcus et al. ............ 438/308 |
| 6,166,509 A | * | 12/2000 | Wyka et al. ............... 318/640 |
| 6,168,961 B1 | * | 1/2001 | Vaccari ..................... 438/16 |

FOREIGN PATENT DOCUMENTS

WO    WO-95/20823    *    8/1995

* cited by examiner

Primary Examiner—Charles Bowers
Assistant Examiner—Asok Kumar Sarkar
(74) Attorney, Agent, or Firm—Blakely Sokoloff Taylor & Zafman

(57) ABSTRACT

According to one aspect of the invention, a method of processing a wafer is provided. The wafer is located in a wafer processing chamber of a system for processing a wafer. A silicon layer is then formed on the wafer while the wafer is located in the wafer processing chamber. The wafer is then transferred from the wafer processing chamber to a loadlock chamber of the system. Communication between the processing chamber and the loadlock chamber is closed off. The wafer is then exposed to ozone gas while located in the loadlock chamber, whereafter the wafer is removed from the loadlock chamber out of the system.

16 Claims, 8 Drawing Sheets

METHOD OF SEALING AN EPITAXIAL SILICON LAYER ON A SUBSTRATE

BACKGROUND OF THE INVENTION

1. Field of the Invention

This invention relates to a method of and a system for sealing an epitaxial silicon layer formed on a semiconductor wafer.

2. Discussion of Related Art

Integrated circuits are formed in and on silicon and other semiconductor wafers. Wafers are made by extruding an ingot from a silicon bath and sawing the ingot into multiple wafers. In the case of silicon, the material of the wafers is monocrystalline. An epitaxial silicon layer is then formed on the monocrystalline material of the wafer. The epitaxial silicon layer is typically doped with boron and has a dopant concentration of about $1 \times 10^{16}$ atoms per centimeter cube. A typical epitaxial silicon layer is about five microns thick. The material of the epitaxial silicon layer has better controlled properties than the monocrystalline silicon for purposes of forming semiconductor devices therein and thereon.

Once the epitaxial silicon layer is formed, the wafer is removed from the wafer processing chamber and exposed to ambient air. The air oxidizes the exposed epitaxial silicon layer to form a native oxide layer thereon. The epitaxial silicon layer and the native oxide layer are exposed to contaminants in the air and are usually filled with impurities and particles. When semiconductor devices are formed on a surface which is filled with impurities, the electronic devices often fail.

It has been suggested that exposure of an epitaxial silicon layer to ozone gas will provide an efficient process for forming a very pure oxide layer on the epitaxial silicon layer.

SUMMARY OF THE INVENTION

According to one aspect of the invention, a method of processing a wafer is provided. The wafer is located in a wafer processing chamber of a system for processing a wafer. An epitaxial silicon layer is then formed on the wafer while the wafer is located in the wafer processing chamber. The wafer is then transferred from the wafer processing chamber to a loadlock chamber of the system. Communication between the processing chamber and the loadlock chamber is closed off. The wafer is then exposed to ozone gas while located in the loadlock chamber, whereafter the wafer is removed from the loadlock chamber out of the system.

BRIEF DESCRIPTION OF THE DRAWINGS

The invention is further described by way of example with reference to the accompanying drawings wherein.

DETAILED DESCRIPTION OF THE INVENTION

The present invention relates to a method whereby an epitaxial silicon layer formed on a silicon wafer is sealed with an oxide formed due to exposure to ozone gas. A plurality of the wafers are located in a batch in a loadlock chamber and exposed to ozone gas under controlled conditions. The ozone gas forms a stable and clean oxide layer on the epitaxial silicon layer of each wafer. The oxide layer can later be removed to leave the epitaxial silicon layer exposed and containing substantially no impurities. There are certain advantages for processing the wafers in the loadlock chamber. One advantage is that another chamber which is designated for a step in an existing process does not have to be dedicated for exposing the wafers to ozone gas. Another advantage is that such a system is relatively safe because there is a substantially reduced likelihood that the ozone gas will mix with hydrogen gas within the system and cause an explosion, in particular because the pressure within the loadlock chamber is lower than a chamber in the system where hydrogen gas is used. The system is also safe because the pressure within the loadlock chamber is always below atmospheric pressure of an area around the loadlock chamber when ozone gas is within the loadlock chamber so that there is reduced likelihood that the ozone gas will escape to a surrounding area and cause an explosion. Another advantage is that the overall time taken to process wafers is maintained.

Figure 1:
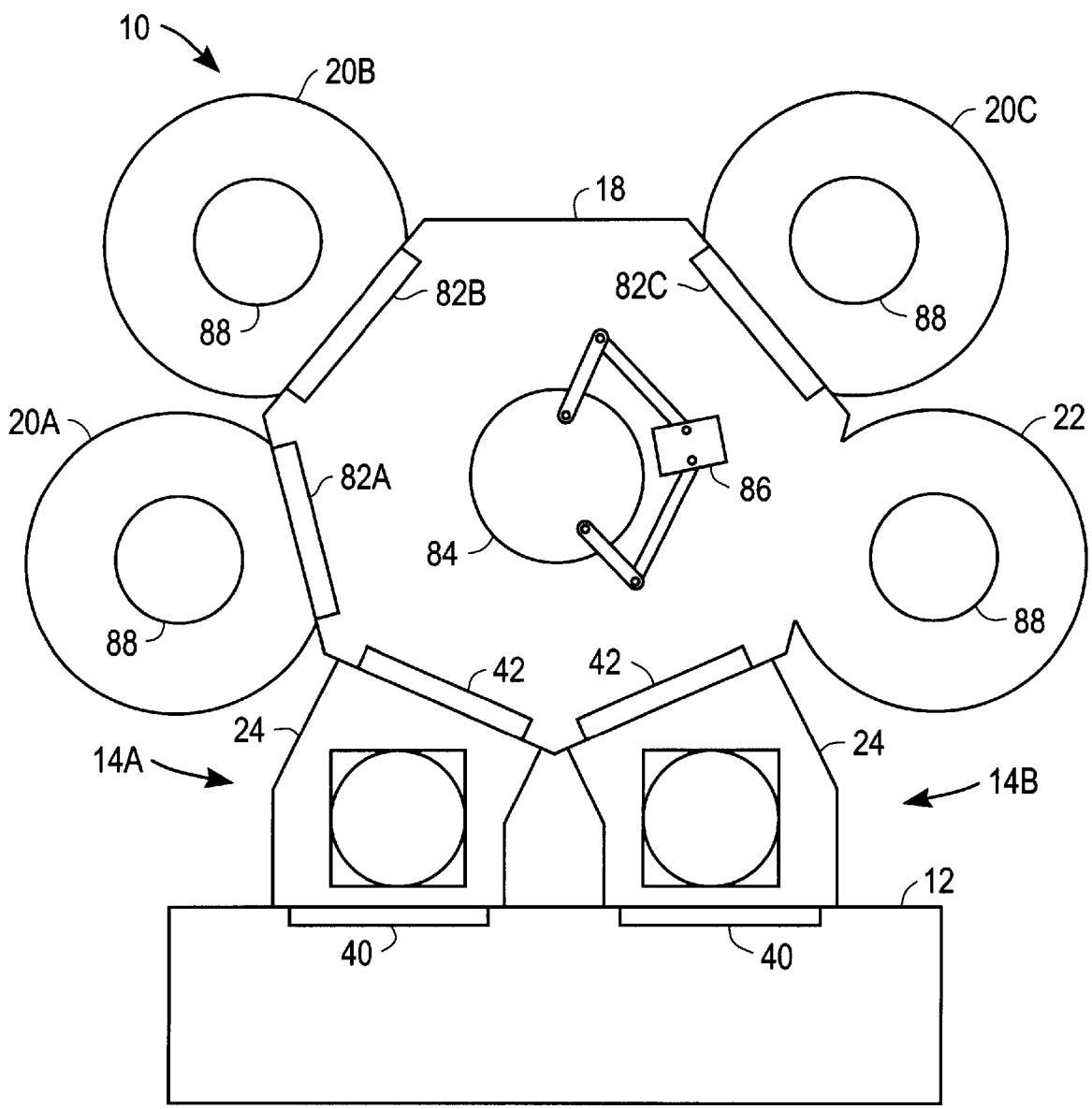
FIG. 1 is a plan view of a system for processing a wafer.

FIG. 1 of the accompanying drawings illustrates a system 10 for processing a semiconductor wafer. The system 10 includes a factory integration unit 12, first and second batch loadlock assemblies 14A and 14B, a transfer chamber 18, first, second, and third wafer processing chambers 20A, 20B, and 20C, and a cooldown chamber 22.

Figure 2:
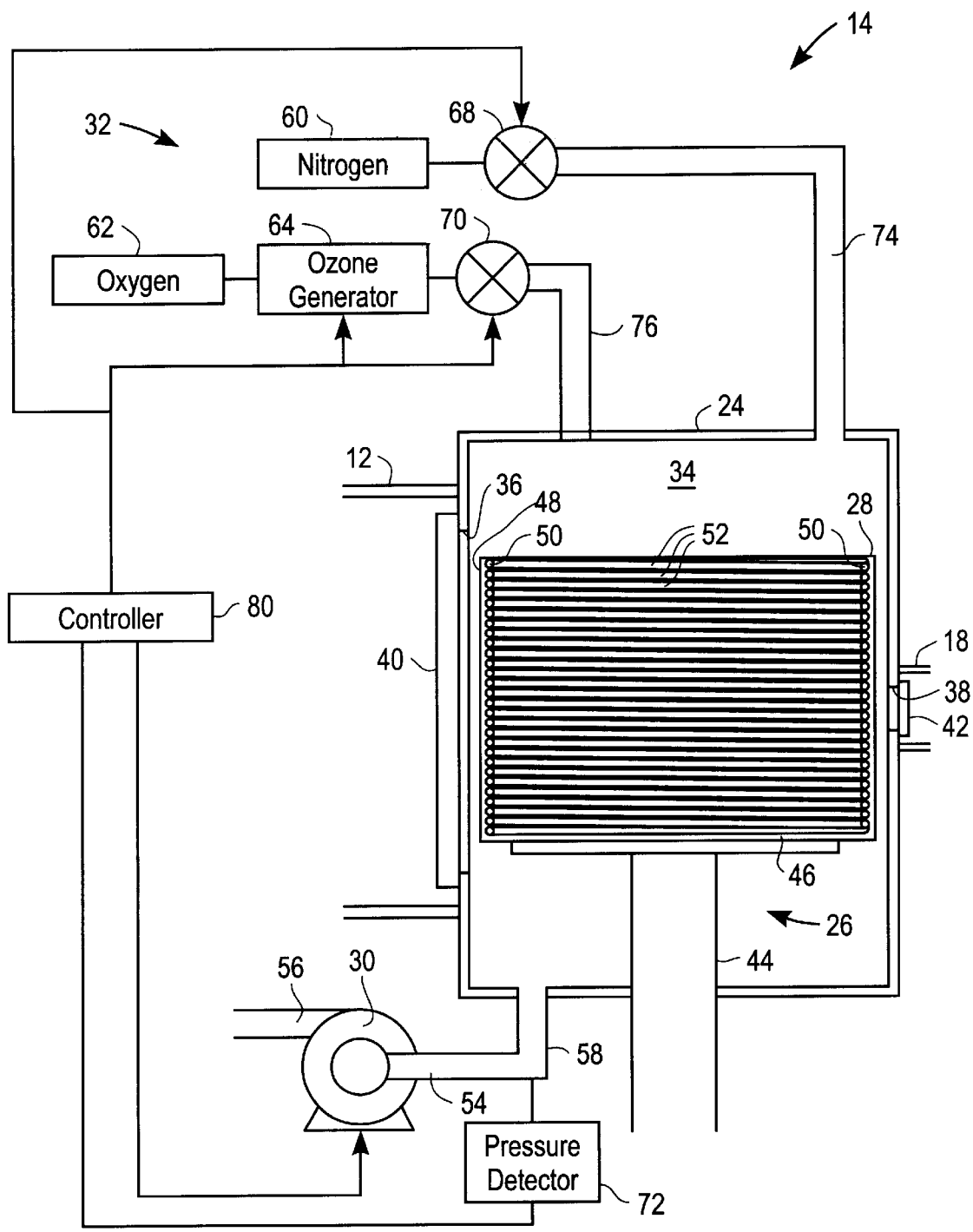
FIG. 2 is a diagram of a loadlock assembly forming part of the system and illustrates a loadlock chamber thereof in sectioned side view.

FIG. 2 illustrates one of the loadlock assemblies 14 in more detail. The loadlock assembly 14 includes a loadlock chamber 24, a cassette elevator 26, a wafer cassette 28, a pump 30, and apparatus 32 for supplying gasses into the loadlock chamber 24.

The loadlock chamber 24 defines an enclosure 34 and has a door opening 36 on one side thereof and a slitvalve opening 38 on an opposing side thereof. The factory integration unit 12 mates with the loadlock chamber 24 over the door opening 36. A door 40 is mounted to the loadlock chamber 24 for movement between a position as shown in FIG. 2 wherein the door 40 closes the door opening 36, and a position wherein the door opening 36 is open so that the confines of the factory integration unit 12 are in communication with the enclosure 34.

The transfer chamber 18 mates with the loadlock chamber 24 over the slitvalve opening 38. A slitvalve 42 is mounted to the loadlock chamber 24 for movement between a position as shown in FIG. 2 wherein the slitvalve 42 closes the slitvalve opening 38, and a position wherein the slitvalve opening 38 is open so that the enclosure 34 is in communication with the confines of the transfer chamber 18.

The cassette elevator 26 includes a shaft 44 and a support plate 46. The shaft 44 extends through an opening in a base of the loadlock chamber 24. A seal (not shown) is located between the shaft 44 and the base of the loadlock chamber 24. The support plate 46 is secured to an upper end of the shaft 44.

The wafer cassette 28 includes a frame 48 with a plurality of fins 50 located on the frame. The fins 50 are positioned relative to one another so as to be jointly capable of supporting a total of twenty-five wafers above one another. The wafer cassette 28 is located on the support plate 46. The wafer cassette 28 can be elevated by extending the shaft 44 into the loadlock chamber 24, and lowered by retracting the shaft 44 from the loadlock chamber 24. By elevating or lowering the wafer cassette 28, a respective one of the wafers 52 can be aligned with the slitvalve opening 38 and can be removed from the loadlock chamber 24 through the slitvalve opening 38.

The pump 30 has a low-pressure side 54 and a high-pressure side 56. An exhaust line 58 has one end that extends into an opening in a base of the loadlock chamber 24, and an opposed end connected to the low-pressure side 54 of the pump 30. The pump 30 can therefore be used for pumping a gas from the enclosure 34.

The apparatus 32 includes a source of nitrogen 60, a source of oxygen 62, an ozone generator 64, a nitrogen supply valve 68, and an ozone supply valve 70.

The source of nitrogen 60 is connected to the nitrogen supply valve 68. The nitrogen supply valve 68 is, in turn, connected to a nitrogen supply line 74. An opposing end of the nitrogen supply line 74 extends into an opening in an upper wall of the loadlock chamber 24. When the valve 68 is open, nitrogen gas from the source of nitrogen 60 can therefore be supplied to the enclosure 34. A diffuser (not shown) is located in the nitrogen supply line 74 to reduce the speed of the nitrogen gas.

The source of oxygen 62 may, for example, be substantially pure oxygen gas or may be air. It has been found that even filtered air is not as free of impurities as substantially pure oxygen. The oxygen is typically about 99.999% pure. Substantially pure oxygen may thus be preferred. The ozone generator 64 is connected to the source of oxygen 62.

When oxygen gas from the source of oxygen 62 is supplied to the ozone generator the ozone generator 64 generates ozone gas. The ozone generator 64 is, in turn, connected to the ozone supply valve 70. An ozone supply line 76 is connected to the ozone supply valve 70. An opposing end of the ozone supply line 76 extends into an opening in the upper wall of the loadlock chamber 24. When the valve 70 is open, ozone gas generated by the ozone generator 64 can be supplied to the enclosure 34. A diffuser (not shown) is located in the ozone supply line 76 to reduce the speed of the ozone gas.

A pressure detector 72 is connected to the exhaust line 58. The pressure detector 72 can detect the pressure within the exhaust line 58, and therefore also the pressure within the enclosure 34.

A controller 80 is used for controlling various components of the system 10 shown in FIG. 1, including the pump 30, the ozone generator 64, and the valves 68 and 70 shown in FIG. 2. The controller 80 receives input from the pressure detector 72 and controls all the components based on the pressure detected by the pressure detector 72 and other variables as will be described hereinbelow. The controller 80 is typically a computer having a processor which is programmed to execute a program which controls all the components of the system 10. The program includes processor executable code and is typically stored on a disk or other computer readable medium and then loaded into memory of the computer from where the processor of the computer reads and executes the program to control the components of the system 10. Particular features of the program and how it is constructed will be evident to one skilled in the art from the discussion that follows.

Referring again to FIG. 1, it can be seen that each wafer processing chamber 20A, 20B, or 20C leads directly off the transfer chamber 18. A respective slitvalve 82A, 82B, and 82C is mounted to open or close communication between the transfer chamber 18 and a respective one of the wafer processing chambers 20A, 20B or 20C.

The cooldown chamber 22 also leads off the transfer chamber 18 but no slitvalve is provided to open and close communication between the transfer chamber 18 and the cooldown chamber 22.

A robot 84 is located within the transfer chamber 18. The robot 84 has a blade 86 which, when the robot 84 is operated, can transfer a wafer from one of the chambers 20, 22, or 24 to another. A susceptor 88 is located in each one of the chambers 20 and 22, on which the wafer can be located by the blade 86. The slitvalves 82 and the robot 84 are also under control of the controller 80 shown in FIG. 2.

Figure 3:
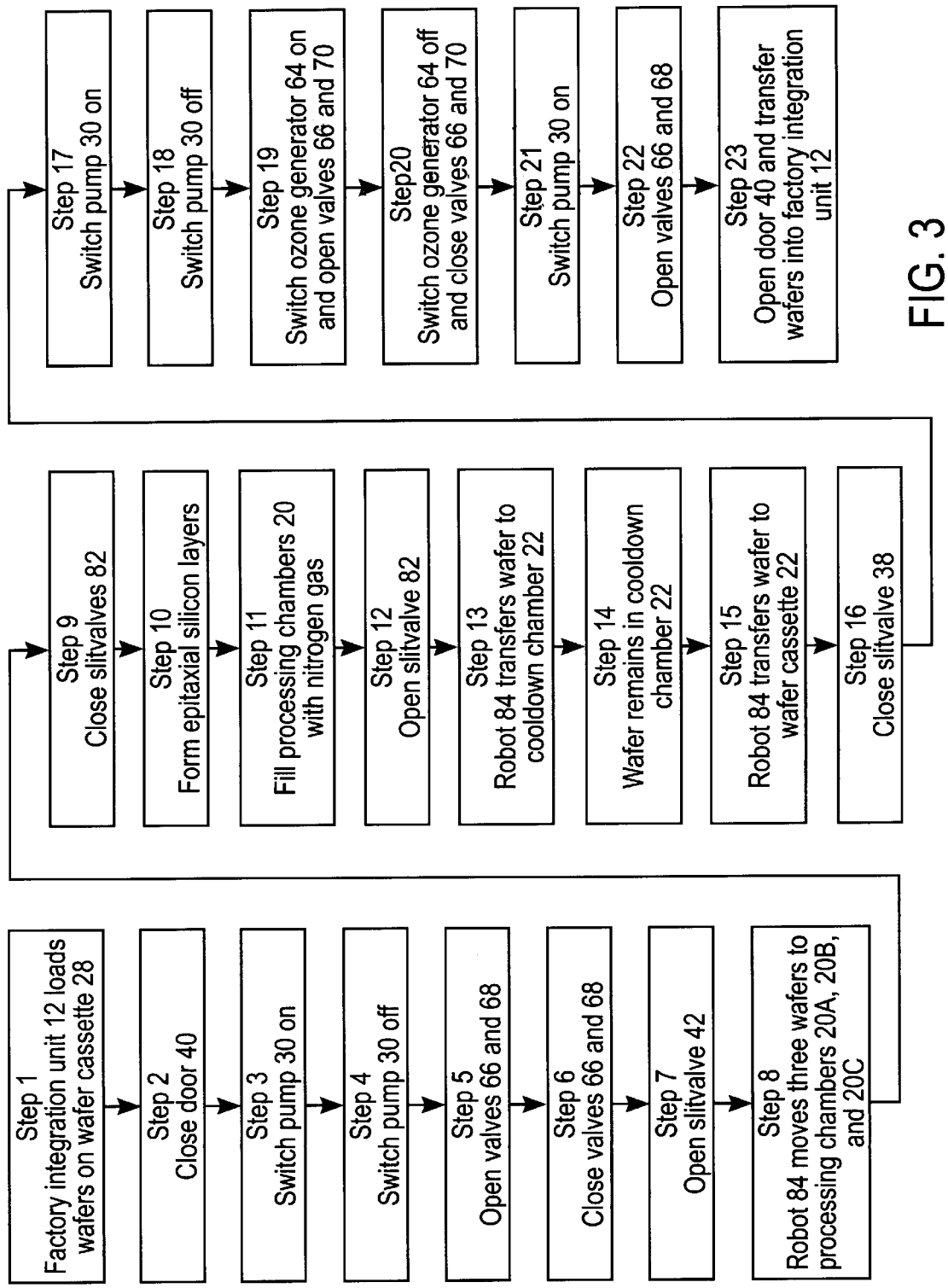
FIG. 3 is a flow chart of how the system is operated.

One example of how the controller 80 controls the system 10 is now described with reference to FIGS. 1 and 2 jointly. FIG. 3 is a flow chart which assists in illustrating how the system 10 is operated.

The slitvalves 42 are initially closed so that the confines of the transfer chamber 18 are not in communication with the loadlock chambers 24. The loadlock chamber 18 is initially evacuated to remove contamination. The loadlock chamber 18 is then backfilled with an inert gas such as nitrogen. The slitvalves 82 are open so that the wafer processing chambers 20 are in communication with the transfer chamber 18. The transfer chamber 18, the wafer processing chamber 20, and the cooldown chamber 22 are filled with an inert gas such as nitrogen gas and are at atmospheric pressure. The door 40 of the first loadlock assembly 14A is open.

A robot (not shown) located within the factory integration unit 12 then loads a total of twenty-five wafers on the wafer cassette 28 of the first loadlock assembly 14A. (Step 1). The door 40 is then closed so that the wafers 52 are isolated within the loadlock chamber 24. (Step 2).

The pump 30 is then switched on so that air passes from the enclosure 34 through the exhaust line 58 through the pump 30. (Step 3). The valves 68, and 70 are closed so that the enclosure 34 is pumped down to a pressure of about 5 Torr.

The pump 30 is then switched off. (Step 4). The valve 68 is then opened. (Step 5). Nitrogen then flows into the enclosure 34 until the pressure within the enclosure 34 is substantially the same as the pressure within the transfer chamber 18. The valve 68 is then closed. (Step 6).

The slitvalve 42 is then opened. (Step 7). The robot 84 then removes three wafers consecutively from the wafer cassette 28 and locates one wafer within the first wafer processing chamber 20A, another wafer within the second wafer processing chamber 20B, and a further wafer within the third wafer processing chamber 20C. (Step 8). The slitvalves 82 are then closed so that the wafer processing chambers 20 are isolated from the transfer chamber 18. (Step 9). An epitaxial silicon layer is then formed on the wafer in each processing chamber 20. (Step 10). A mixture of gasses is introduced into each one of the wafer processing chambers 20. One of these gasses includes hydrogen. Another one of the gasses is a source of silicon such as silane, dichlorosilane, or trichlorosilane. The source of silicon reacts with the hydrogen to form an epitaxial layer. Another one of the gasses is typically $B_2H_6$ which provides boron for purposes of doping the epitaxial silicon layer. Heat lamps (not shown) heat the wafers within the wafer processing chambers 20 to a temperature of between 600° C. and 1300° C.

Once the formation of the epitaxial silicon layer on one of the wafers is finalized, the processing gasses within the respective chambers 20 are replaced by pure hydrogen gas to purge the chambers 20. (Step 11). The respective slitvalve 82 is then opened. (Step 12). The respective wafer is transferred, utilizing the robot 84, to the cooldown chamber 22. (Step 13). Transfer of the wafer takes about twenty seconds. The wafer remains within the cooldown chamber 22 for about sixty seconds. (Step 14). The robot 84 then transfers the wafer from the cooldown chamber 22 back to the wafer cassette 28. (Step 15). The wafer is thus transferred from the chambers 20 to the wafer cassette 28 without ever being exposed to oxygen or any other gas that can form an oxide on the epitaxial silicon layer.

The process of forming an expitaxial silicon layer on each wafer is continued until all the wafers are processed in a similar manner and all the wafers are located back on the wafer cassette 28. It takes between one and two hours to process twenty-five wafers when forming a 5 micron thick epitaxial silicon layer on each wafer. While the wafers from the first loadlock assembly 14A are processed, more wafers can be located on the wafer cassette 28 of the second loadlock assembly 14B.

Once the wafers are located on the wafer cassette 28 of the first loadlock assembly 14A, the slitvalve 38 thereof is closed. (Step 16). The wafers 52 are then at a temperature of less than 100° C., but this temperature can vary depending on the time spent in the cooldown chamber 22.

The pump 30 is then again switched on so that nitrogen gas then flows out of the enclosure 34. (Step 17). The enclosure 34 is pumped down to a pressure of about 5 Torr. The pump 30 is then switched off. (Step 18). The ozone generator 64 is then switched on and the valve 70 is opened so that an ozone gas and oxygen gas mixture flows into the top of the enclosure 34. (Step 19). The ozone gas and oxygen mixture continues to flow into the enclosure 34 until the pressure within the enclosure 34 reaches about 600 Torr. The valve 70 is then closed and the ozone generator 64 is switched off. (Step 20).

The wafers 52 are then simultaneously exposed to the ozone gas within the enclosure 34. Exposure of the epitaxial silicon layer on the wafer 52 results in oxidation of the epitaxial silicon layer. The wafers 52 are exposed to the ozone gas for a period from one to fifteen minutes. The wafers 52 are simply "soaked" in the ozone gas i.e., there are no additional sources of excitation which, for example, create a plasma or create certain photo effects. An oxide layer forms over the epitaxial silicon layer of each wafer and has a thickness of about 10 Å to about 15 Å, as measured by a multiple wavelength ellipsometry technique, for exposure to ozone gas of about fifteen minutes. The oxide layer that forms on the wafer is extremely pure because of the controlled conditions to which the wafers 52 are exposed, including the purity of the ozone gas and oxygen gas mixture to which the wafers 52 are exposed.

As mentioned previously, hydrogen is used within the wafer processing chamber 20. Hydrogen is highly explosive when mixed with ozone or oxygen. However, for the hydrogen in the processing chambers 20 to mix with the ozone within the enclosure 34, the system 10 has to fail simultaneously in a number of respects. First, there should be hydrogen within one of the wafer processing chambers 20. Second, the hydrogen should leak past a respective slitvalve 82 of the relevant wafer processing chamber 20. Leakage of hydrogen past the slitvalve 82 would only occur if the slitvalve 82 does not seal sufficiently on the wafer processing chamber or when the slitvalve 82 is not closed when hydrogen is introduced into the wafer processing chamber 20. Third, it is required that ozone be present within the enclosure 34. Fourth, ozone should leak from the enclosure 34 into the transfer chamber 18. Because the enclosure 34 is maintained at a pressure below that of the transfer chamber 18, it is highly unlikely that there would be any flow of gasses from the enclosure 34 into the transfer chamber 18.

Furthermore, it should be noted that the pressure within the enclosure 34 never goes over atmospheric pressure so that there is a substantially reduced likelihood that ozone gas can escape from the enclosure 34 to a surrounding area and cause exposure of personnel.

It should also be noted that, in the embodiment described, ozone is only present within the apparatus 32 when generated by the ozone generator 64 which is only while the enclosure 34 is being filled with ozone. There is therefore no contained source of ozone (other than in the loadlock chambers 24) which may leak and cause exposure to personnel or other reactive gasses. Ozone gas is thus generated at the point of use.

The pump 30 is then again switched on so that the pressure within the enclosure 34 reduces to about 5 Torr. (Step 21). The ozone gas flowing through the pump 30 is pumped to a location distant from the system 10, where the ozone gas is neutralized. The ozone gas may for example be neutralized by treatment with a chemical to form oxygen, be scrubbed in a fluidized bed of silica, or be scrubbed in another liquid system.

The valve 68 is then opened so that the enclosure 34 is filled with nitrogen gas. (Step 22). The door 40 is then opened and the wafers 52 are transferred from the enclosure 34 into the factory integration unit 12. The factory integration unit 12 is filled with air. (Step 23). The air within the factory integration unit 12 does not form an oxide layer on the epitaxial silicon layer because of the oxide layer which is already formed thereon due to exposure to ozone.

Figure 4:
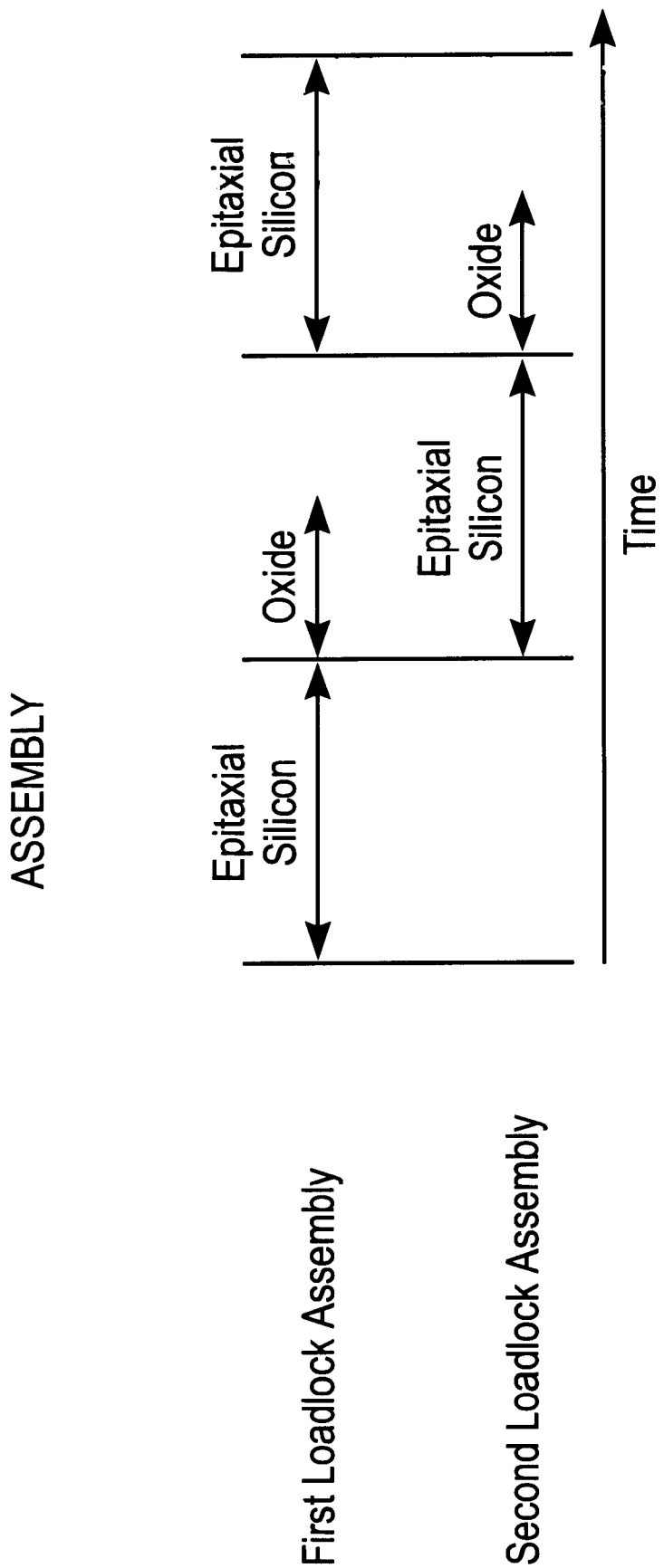
FIG. 4 is a time chart of how the system operates.

It takes about twenty-five minutes to process the wafers within the first loadlock assembly 14A, as measured from when the slitvalve 42 is closed until the wafers 52 are removed from the loadlock chamber 24. The time taken to process twenty-five wafers by the first loadlock assembly 14A is less than the time taken to process twenty-five wafers within the wafer processing chambers 20 and cooling the wafer down in the cooldown chamber 22, because the wafers are processed in batch. As illustrated in FIG. 4 the first loadlock assembly 14A can thus be used in an epitaxial silicon cycle wherein wafers are transferred to the wafer processing chamber 20 and the cooldown chamber 22. The first loadlock assembly 14A can then be used in a oxide cycle wherein the wafer is exposed to ozone gas. At the same time when the first loadlock assembly 14A is used for an oxide cycle, the second loadlock assembly 14B can be used for a epitaxial silicon cycle, whereafter the second loadlock assembly 14B can be used for an oxide cycle. When the second loadlock assembly 14B is used in the oxide cycle, the first loadlock assembly 14A can be used in a epitaxial silicon cycle. It can thus be seen that, because the oxide cycles are shorter than the epitaxial silicon cycles, there is no lapse in time from one epitaxial silicon cycle to a next epitaxial silicon cycle.

Figure 5:
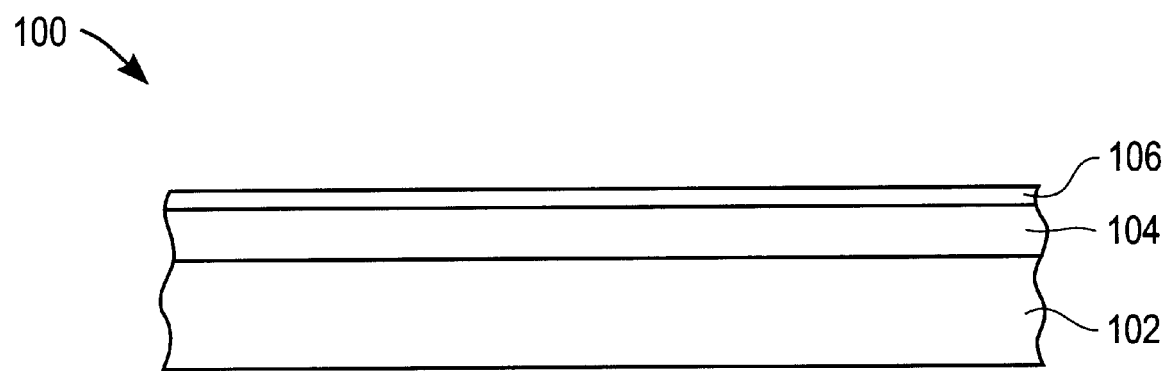
FIG. 5 is a cross-sectional side view of a wafer which is processed according to the invention.

FIG. 5 illustrates a wafer 100 which is processed in accordance with the invention. The wafer includes a monocrystalline substrate 102 on which an epitaxial silicon layer 104 is formed. A silicon dioxide layer 106 is formed on the epitaxial silicon layer 104. The silicon dioxide layer can later be removed to leave the expitaxial silicon layer 104 exposed and containing substantially no impurities. The silicon dioxide layer can, for example, be removed in a aqueous solution of hydrogen fluoride.

Figure 6:
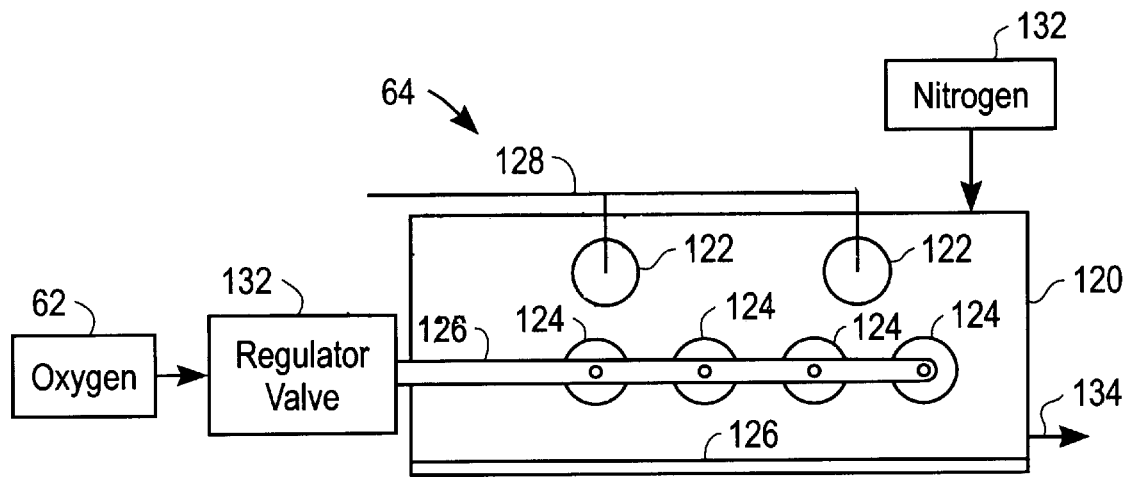
FIG. 6 is a cross-sectional end view of an ozone generator which is used in the loadlock assembly.
Figure 7:
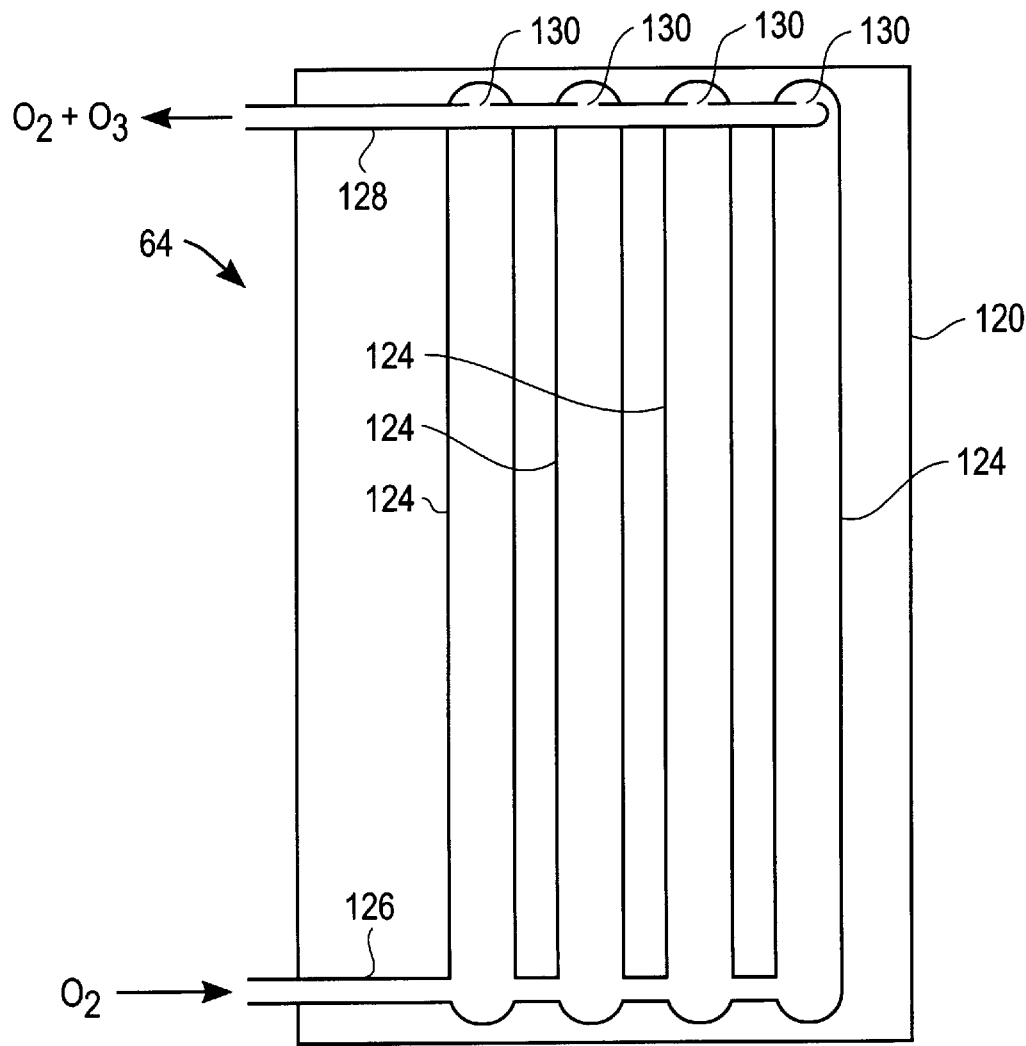
FIG. 7 is a cross-sectional side view of the ozone generator.

FIG. 6 and FIG. 7 illustrate the ozone generator 64 in more detail. The ozone generator 64 includes a housing 120, two ultraviolet lamps 122, four quartz tubes 124, an inlet pipe 126, and an outlet pipe 128.

The housing 120 is leak tight and dust proof. A mirror 126 is located on a lower surface of the housing 120.

The ultraviolet lamps 122 are located within the housing 120 on a side thereof opposing the mirror 126. Electrical connectors 128 extend into the housing 120 to the ultraviolet lamps 122. The ultraviolet lamps 122 can be energized by supplying electricity through the cables 128. A leak tight interface exists between the housing 120 and the cables 128 where the cables extend into the housing 120.

Each pipe 126 or 128 extends into the housing 120. A leak tight interface also exists between each pipe 126 or 128 and the housing 120 where the pipe 126 or 128 extends into the housing 120. The pipes 126 and 128 are located on opposing sides of the housing 120 as can be seen in FIG. 7. The inlet pipe 126 has an inlet opening therein. The pipe 126 interconnects ends of the tubes 124 to one another. The pipe 128 extends through ends of the tubes 124 opposing the ends that are interconnected by the pipe 126. Small openings 130 are formed in the pipe 128 within the tubes 124. Each opening 130 is about 2 mm in diameter. The openings 130 are located facing away from a flow passage of a gas flowing through the tubes 126 so as to avoid a flow channel within each tube 126 and to ensure mixing of a gas flowing through each tube 126.

The oxygen source 62 is connected to the inlet tube 126 through a regulator valve 132. The regulator valve 132 can be adjusted so as to control flow to the inlet tube 126.

A nitrogen source 132 is connected to the housing 120. A purge gas outlet 134 is also provided out of the housing 120.

Nitrogen from the nitrogen source 132 flows through the housing 120 in an area around the tubes 124. The ultraviolet lamps 122 are switched on by providing electricity through the cables 128. Oxygen from the oxygen source 62 flows through the regulator valve 132 and the pipe 126 to the tubes 124. Ultraviolet light is transmitted by the ultraviolet lamps 122. The quartz of the tubes 124 is transmissive so that the ultraviolet light enters the tubes 124. One of the ultraviolet lamps is located above two of the tubes 124 and another one of the ultraviolet lamps 122 is located above another two of the tubes 124. A substantially equal amount of ultraviolet light enters the tubes 124 because of substantially equal spacing of the lamps 122 over the tubes 124. More ultraviolet light reflects from the mirror 126 and enters the tubes 124 from an opposing side. The ultraviolet light results in a change of some of the oxygen gas within the tubes 124 to ozone gas. A mixture of oxygen gas and ozone gas flows around the pipe 128 and leaves the tubes 124 through the openings 130, from where the mixture flows through the pipe 128 out of the housing 120. While ozone is formed within the tubes 124, the nitrogen in the area around the tubes 124 suppresses ozone generation outside of the tubes 124. This reduces exposure of ozone to people, thereby making the ozone generator 64 safe to operate, and reduces the chance of ozone degradation of components of the ozone generator 64 located externally of the tubes 124.

The openings 130 are restrictions in the path of the mixture of oxygen and ozone leaving the tubes 124. Because of the restrictions provided by the openings 120, free flow of gas through the tubes 124 is restricted. Because of restrictions provided by the openings 120, the gas remains within the tubes 124 for longer and the flow thereof is more evenly distributed between the tubes 124. The residence time of the mixture within the tubes 124 is also increased.

Figure 8:
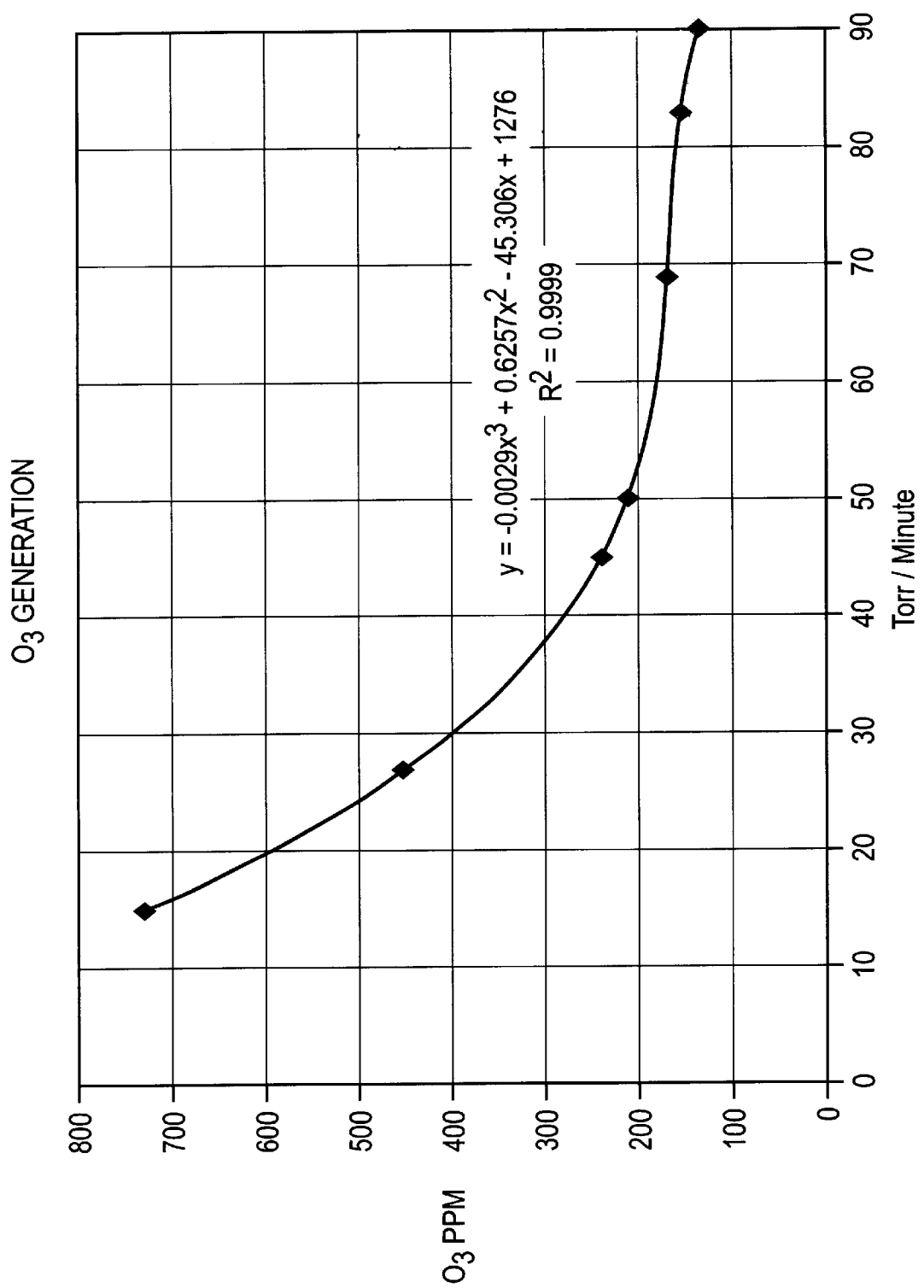
FIG. 8 is a graph of ozone concentration against backfill rate.

FIG. 8 is a graph of ozone generation. A horizontal axis of FIG. 8 is the rate at which the loadlock chamber is filled in Torr per minute. The higher the valve on the horizontal axis, the faster the loadlock chamber will be filled. A backfill rate of 60 Torr per minute, for example, means that the loadlock chamber is filled to 600 Torr within 10 minutes. The loadlock is preferably filled to 600 Torr within 20 minutes to maintain throughput, i.e. the rate on the horizontal axis is preferably at least 30.

A vertical axis of the FIG. 8 graph is ozone concentration in parts per million. It can be seen from the graph that the ozone concentration is higher for lower filling rates of the load lock chamber. Furthermore, there is an appreciable increase in ozone concentration for filling rates below 50 (i.e. a filling time of more than 12 minutes). The filling rate is therefore preferably between 20 Torr per minutes and 50 Torr per minute for purposes discussed with reference to FIG. 8 alone.

Figure 9:
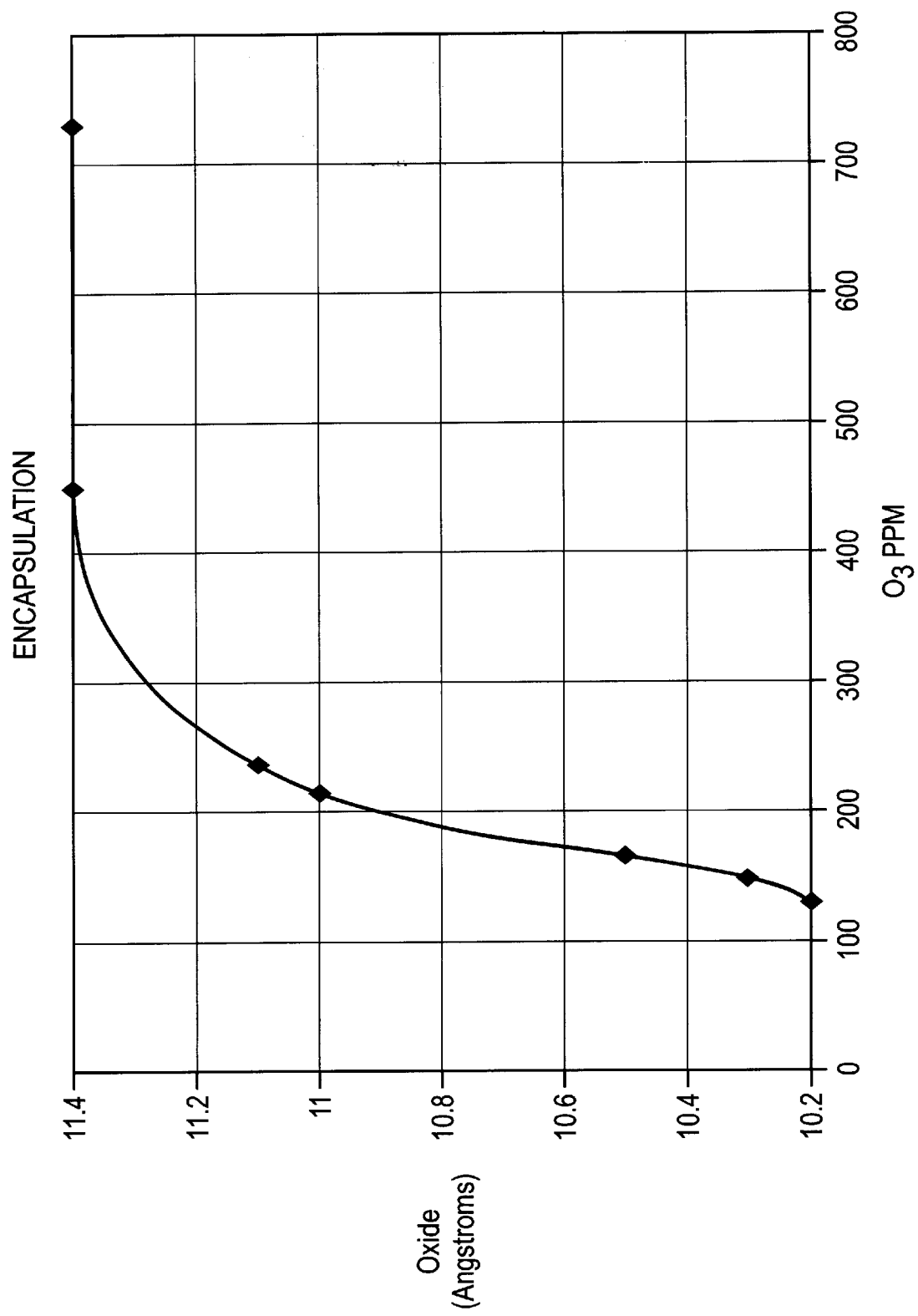
FIG. 9 is a graph of oxide formation against ozone concentration.

FIG. 9 is a graph of encapsulation of a wafer with an oxide formed with ozone gas. A horizontal axis of the FIG. 9 graph is the ozone concentration in parts per million and the vertical axis is oxide thickness as measured with a single wavelength ellipsometry technique. The wafer is maintained at about room temperature and is exposed to the air and ozone gas mixture for 12 minutes. There is an increase in oxide thickness with ozone concentration up to an ozone concentration of about 400 parts per million. In order to obtain an oxide thickness which is sufficiently thick the ozone concentration is preferably at least 250 parts per million. From FIG. 9 can thus be gathered that the ozone concentration is preferably between 250 parts per million and 350 parts per million. Referring again to FIG. 8, it can be seen that such an ozone concentration requires a filling rate of between 33 Torr per minute and 45 Torr per minute. In order to maintain an ozone concentration of at least 250 parts per million and an appreciable oxide thickness, the loadlock is preferably filled at a rate of about 45 Torr per minute.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art. In another embodiment an ozone source may, for example, be a contained source of ozone located externally of a loadlock chamber. In another embodiment, an ozone source such as an ozone generator may, for example, be located within a loadlock chamber.

What is claimed:

1. A method of processing a wafer, which includes:
   (a) locating a wafer in a wafer processing chamber of a system for processing a wafer;
   (b) forming a silicon layer on the wafer while located in the wafer processing chamber;
   (c) transferring the wafer from the wafer processing chamber to a loadlock chamber of the system while remaining substantially unexposed to air, the wafer being transferred through a slitvalve opening of the loadlock chamber into the loadlock chamber;

(d) closing the slitvalve opening;

(e) introducing ozone gas in the loadlock chamber;

(f) exposing the wafer to the ozone gas after being transferred from the processing chamber and while located in the loadlock chamber; and (g) removing the wafer from the loadlock chamber out of the system, the wafer being removed through a door opening of the loadlock chamber, the door opening being a different opening than the slitvalve opening.

2. A method according to claim 1 wherein the system includes a transfer chamber leading off the loadlock chamber, and a plurality of wafer processing chambers leading off the transfer chamber, the wafer being transferred from the wafer processing chamber through the transfer chamber to the loadlock chamber.

3. A method according to claim 1 which includes:

(h) loading a plurality of wafers in the loadlock chamber, wherein:

step (a) includes transferring a respective wafer from the loadlock chamber into a respective one of the processing chambers;

step (b) includes forming a silicon layer on each one of the respective wafers, wherein a silicon layer is formed on one of the wafers in one of the chambers while a silicon layer is formed on another wafer in another one of the chambers;

step (c) includes transferring the plurality of wafers to the loadlock chamber;

step (d) includes closing the slitvalve between the loadlock chamber and the transfer chamber;

step (f) includes exposing the wafers together to ozone gas while located in the loadlock chamber; and step (g) includes removing the plurality of wafers from the loadlock chamber out of the system.

4. A method according to claim 3 wherein the time taken from when step (a) is started until step (d) is completed is at least twice as long as the time from when step (d) is completed until step (g) is completed.

5. A method according to claim 3 wherein the loadlock chamber is a first loadlock chamber and the plurality of wafers is a first plurality of wafers, the method including:

(i) locating a second plurality of wafers in a second loadlock chamber;

(j) transferring a respective wafer from the second loadlock chamber into a respective one of the processing chambers;

(k) forming a silicon layer on each one of the wafers of the second plurality of wafers located in one of the chambers;

(l) transferring the second plurality of wafers to the second loadlock chamber;

(m) closing off communication between the second loadlock chamber and the transfer chamber;

(n) exposing the second plurality of wafers together to ozone gas while located in the second loadlock chamber; and (o) removing the second plurality of wafers from the second loadlock chamber out of the system.

6. A method according to claim 5 wherein steps (d), (f) and (g) are carried out entirely within a time period from when step (j) is started until step (m) is completed.

7. A method according to claim 5 wherein, when step (f) is carried out, the pressure within the first loadlock chamber is below the pressure in the transfer chamber.

8. A method according to claim 2 wherein the pressure within the loadlock chamber remains below the pressure within the transfer chamber while the wafer is exposed to the ozone gas.

9. A method according to claim 1 wherein the system includes a cooldown chamber, the wafer being transferred from the wafer processing chamber to the cooldown chamber and from the cooldown chamber to the loadlock chamber.

10. A method according to claim 1 wherein a plurality of wafers, each having a silicon layer formed thereon, are located in the loadlock chamber and the plurality of wafers are simultaneously exposed to the ozone gas.

11. A method according to claim 1 which includes introducing the ozone gas from outside the loadlock chamber into the loadlock chamber.

12. A method according to claim 1 which includes generating the ozone gas.

13. A method of processing a wafer, which includes:

(a) locating a wafer in a wafer processing chamber of a system from processing a wafer;

(b) forming a silicon layer on the wafer while located in the wafer processing chamber;

(c) transferring the wafer processing chamber to a loadlock chamber of the system while remaining substantially unexposed to air, the wafer being transferred through a slitvalve opening of the loadlock chamber into the loadlock chamber;

(d) closing the slitvalve opening;

(e) introducing ozone gas in the loadlock chamber;

(f) exposing the wafer to the ozone gas after being transferred from the processing chamber and while located in the loadlock chamber;

(g) removing ozone from the loadlock chamber, the pressure in the loadlock chamber during (f) and (g) remaining below the pressure in the processing chamber; and (h) removing the wafer from the loadlock chamber out of the system, the wafer being removed through a door opening of the loadlock chamber, the door opening being a different opening than the slitvalve opening.

14. A method according to claim 13 wherein hydrogen gas is present within the processing chamber of any given time between when (g) is started and (h) ends.

15. A method according to claim 13 wherein the pressure within the loadlock chamber remains below atmospheric pressure during (f) and (g).

16. A method according to claim 1 wherein substantially no oxide layer forms on the silicon layer before exposure to the ozone gas.

* * * * *